United States Patent [19]

Bouldin

[11] Patent Number: 5,514,974
[45] Date of Patent: May 7, 1996

[54] TEST DEVICE AND METHOD FOR SIGNALLING METAL FAILURE OF SEMICONDUCTOR WAFER

[75] Inventor: Dennis P. Bouldin, Essex Junction, Vt.

[73] Assignee: International Business Machines Corporation, Armonk, N.Y.

[21] Appl. No.: 321,938

[22] Filed: Oct. 12, 1994

[51] Int. Cl.[6] ........................................ G01R 1/04
[52] U.S. Cl. ...................... 324/763; 324/756; 324/158.1
[58] Field of Search .............................. 324/756, 158.1, 324/525, 756–763, 718–719, 538, 501, 537; 361/385

[56] References Cited

U.S. PATENT DOCUMENTS

| | | | |
|---|---|---|---|
| 5,049,811 | 9/1991 | Dreyer et al. | 324/73.1 |
| 5,244,839 | 9/1993 | Baker et al. | 437/205 |
| 5,264,377 | 11/1993 | Chesire et al. | 437/8 |
| 5,300,307 | 4/1994 | Frear et al. | 427/96 |
| 5,318,924 | 4/1994 | Lin et al. | 437/192 |

FOREIGN PATENT DOCUMENTS

| | | |
|---|---|---|
| 0484013A2 | 5/1992 | European Pat. Off. . |
| 2176653 | 12/1986 | United Kingdom . |

OTHER PUBLICATIONS

Griffin et al., "Integrated Test Structure," IBM Technical Disclosure Bulletin, vol. 29, No. 5, pp. 2124–2125, Oct. 1986.

Cronin et al., "Totally Encased Line Electromigration Monitor," IBM Technical Disclosure Bulletin, vol. 30, No. 12, pp. 195–196, May 1988.

"Monitor System for Electromigration Extrusion Detection," Research Disclosure, Kenneth Mason Publication, Ltd., England, No. 241, p. 224, May 1984.

Primary Examiner—Kenneth A. Wieder
Assistant Examiner—Barry C. Bowser
Attorney, Agent, or Firm—Heslin & Rothenberg

[57] ABSTRACT

Method and test structures for accurately flagging metal failure on a semiconductor wafer include a monitor structure and a control structure, each of which has a plurality of metal segments. At least one metal segment of the monitor structure has a length prone to failure, while the length of the metal segments in the control structure are such that the control structure is resistant to metal failure. The monitor and control structures are predesigned to have equal resistance when there is no metal failure and a measurable resistance difference upon metal failure in that segment of the monitor structure prone to failure. Upon detecting metal failure in the test device, the wafer is flagged as potentially having metal failure in active circuitry interconnect wiring.

37 Claims, 4 Drawing Sheets

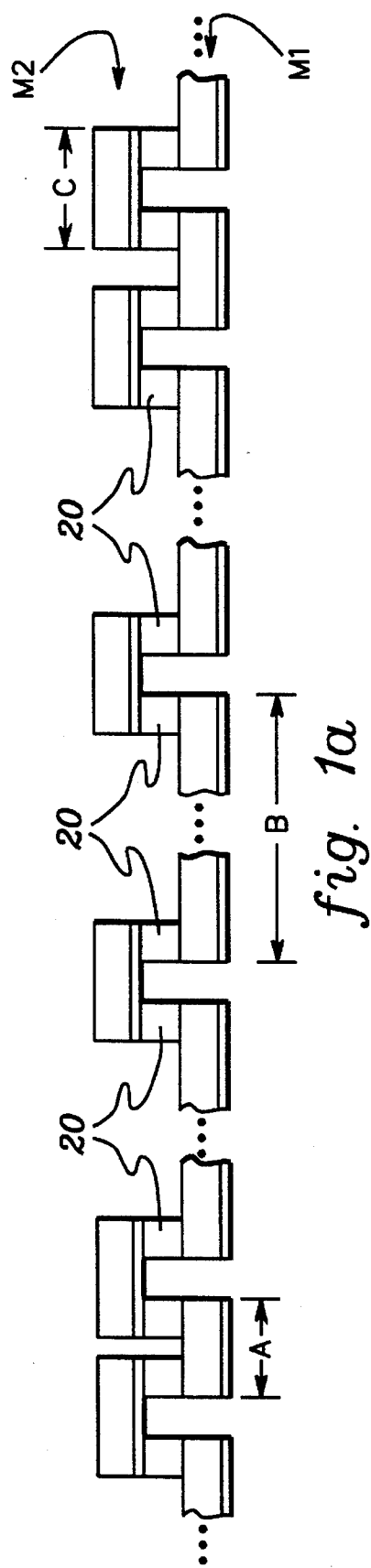
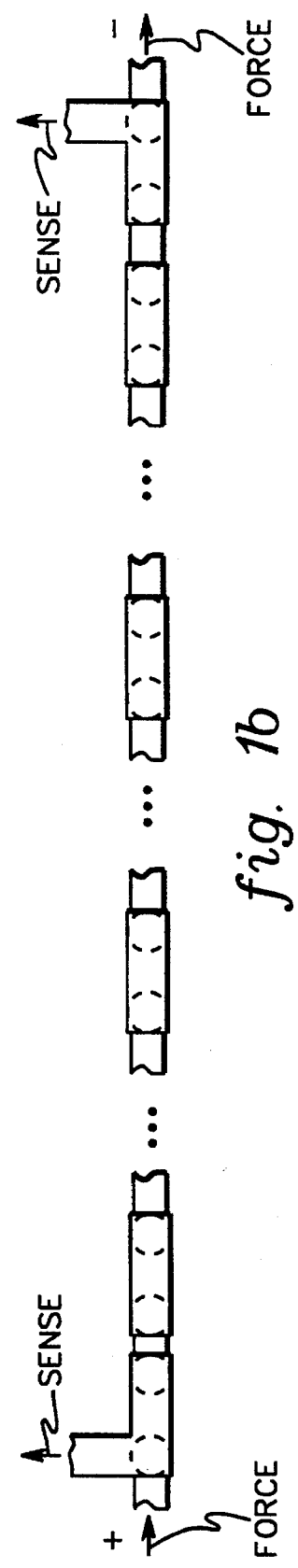
fig. 1a
fig. 1b

TEST DEVICE AND METHOD FOR SIGNALLING METAL FAILURE OF SEMICONDUCTOR WAFER

TECHNICAL FIELD

This invention relates in general to fabrication and testing of interconnection networks for integrated circuits and, in particular, to devices and methods for testing a semiconductor wafer for possible metal failure of integrated circuit interconnect thereon.

BACKGROUND ART

Reliability of integrated circuits is a significant consideration both in terms of fabrication and subsequent use. Attempts are continually being made to ensure high reliability at all stages of the fabrication process. For example, where feasible electromigration test structures are incorporated on semiconductor wafers with the formation of integrated circuits therein. Each integrated circuit can then individually be electrically bonded to the test structures to determine whether electromigration may cause failure of the integrated circuit.

Very-large-scale integration (VLSI) aluminum-based metallizations can be subject to failure due to various non-electrical forces, both during fabrication and more gradually, in field use. As presented herein, these two types of non-electrical failures are respectively referenced as a "quality" problem and a "reliability" problem. The present invention is particularly advantageous in connection with addressing the "quality" issue. This is because fabrication-resultant failures must necessarily be identified from a single test during or subsequent to semiconductor fabrication.

Today's metallization practice is to layer aluminum (Al) interconnect with thin films of refractory materials, such as titanium or tungsten, so that if a void in the aluminum forms, electrical continuity through the interconnect is maintained, albeit at increased resistance. Unfortunately, the increased resistance is typically insufficient to identify the failed interconnect conductor. This is because the additional resistance due to the aluminum void is often insufficient to distinguish the interconnect line from a normal resistance sampling after accounting for measurement variations.

The principal solution presently in use to identify fabrication-type metal failures is to perform a physical construction analysis of interconnect conductors of interest. For example, conductors can be physically delayered and examined with a scanning electron microscope. Such an approach, however, is clearly time consuming and destructive.

Another approach to detecting metal failures during fabrication is to employ laser technology to evaluate reflectivity responses of the interconnect conductors. Unfortunately, such an approach has proven difficult to calibrate, has limitations concerning distinguishing voids in narrow lines and near tungsten interconnect studs, and is clearly more laborious than a direct electrical measurement approach.

A further option might be the use of some variation of "burn-out testing," described in the literature as "SWEAT" (Standard Wafer-level Electromigration Acceleration Test). This test provides for passing a much larger current than used for the "long-term" test through a test structure that is optimized for the accelerated test. The large current provides for joule heating of the test conductor only, which avoids the necessity for heating the entire wafer. The SWEAT technique is described in "Wafer Level Electromigration Test For A Production Monitoring," B. J. Root et al., in the *Proceedings of the International Reliability Physics Symposium*, pp. 100–107 (1985). The disadvantage to this technique is that the tests are time consuming and destructive to the tested structure, and would be less directly correlatable to non-electrical metal failures such as the metal voids principally addressed herein.

A still further option would be to employ electrical measurements more sensitive to metallization degradation than simple resistance measurements, for example, 1/frequency noise. The method of applying such techniques to wafer monitoring has been described in European Patent document 0484013 A2, entitled "Method for Manufacturing An Integrated Circuit". The drawbacks to this approach, however, are the questionable adaptability of the technique in practice, the sophisticated test equipment required to perform the technique, and the long test time required.

Multiple "reliability" type measurements are less problematic because precise measurements as a function of time can be compared to previous measurements to identify resistance increases resulting, for example, from metal failure. Even in such cases, however, other factors such as temperature variations can confound measurements. The devices and methods described herein assist in minimizing these confounding affects and, thus, in obtaining a more accurate indication of metal failure growth for evaluating "reliability".

Thus, a need exists in the integrated circuit fabrication art for a simple, reliable technique for electrically identifying a semiconductor wafer as possibly having non-electrically induced, metal failure in the integrated circuit interconnect on the wafer.

DISCLOSURE OF INVENTION

Briefly described, the invention comprises in one aspect a test device for signalling possible metal failure of a semiconductor wafer. The test device includes a metal monitor structure and a metal control structure. The metal monitor structure is prone to metal failure, while the metal control structure is designed to resist metal failure. The structures are further designed with identical resistances with no metal failure of the metal monitor structure and a resistance difference upon metal failure of the metal monitor structure. The resistance difference signals possible metal failure at an active region of the semiconductor wafer.

In a specific embodiment, the metal monitor structure of the test device comprises a first plurality of metal segments electrically connected together, with at least one metal segment of the first plurality of metal segments prone to metal failure. The control structure comprises a second plurality of metal segments electrically connected together such that no metal segment of the second plurality of metal segments is prone to metal failure. Again, the monitor structure and the control structure have substantially identical resistances without metal failure of the at least one metal segment prone to metal failure, and a resistance difference upon metal failure of the at least one segment prone to metal failure. This resistance difference signals possible metal failure above an active region of the semiconductor wafer.

As a further enhancement, a plurality of test devices, each structured as outlined above, can be disposed in an inactive region of the semiconductor wafer. If desired, different test devices can be configured to experience different mechanical forces.

In still another aspect, a method is provided for fabricating a test device for flagging possible metal failure on a semiconductor wafer. The method includes the steps of: predesigning a metal monitor structure and a metal control structure such that the metal monitor structure is prone to metal failure and the metal control structure is resistant to metal failure, and such that the metal monitor structure and the metal control structure have substantially identical resistances without metal failure of the monitor structure and a resistance difference upon metal failure of the monitor structure, the resistance difference indicating possible metal failure on the semiconductor wafer; and fabricating the metal monitor structure and the metal control structure at an inactive region of the semiconductor wafer.

In all aspects, the present invention embodies a simple electrical technique for monitoring non-electrically induced metal failure to assure quality and reliability of integrated circuit interconnect wiring against metal failures, such as metal voids. The technique can employ various different device configurations according to numerous factors, such as space available, measurement sensitivity, extent of voiding deemed critical, etc. The monitor and control structures of the test device can be designed in series with a voltage tap in the middle to allow, for example, Kelvin measurements of both structures with a common current source. Further, a series of monitors and control structures could also be implemented to increase the likelihood of detecting voids. An optimization of these options is possible based on the assumptions of void nucleation and resistance increase statistics.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIGS. 1a & 1b are elevational and plan views, respectively, of one embodiment of a metal monitor structure in accordance with the present invention, shown implemented in two metallization levels;

BEST MODE FOR CARRYING OUT THE INVENTION

Figure 2A:
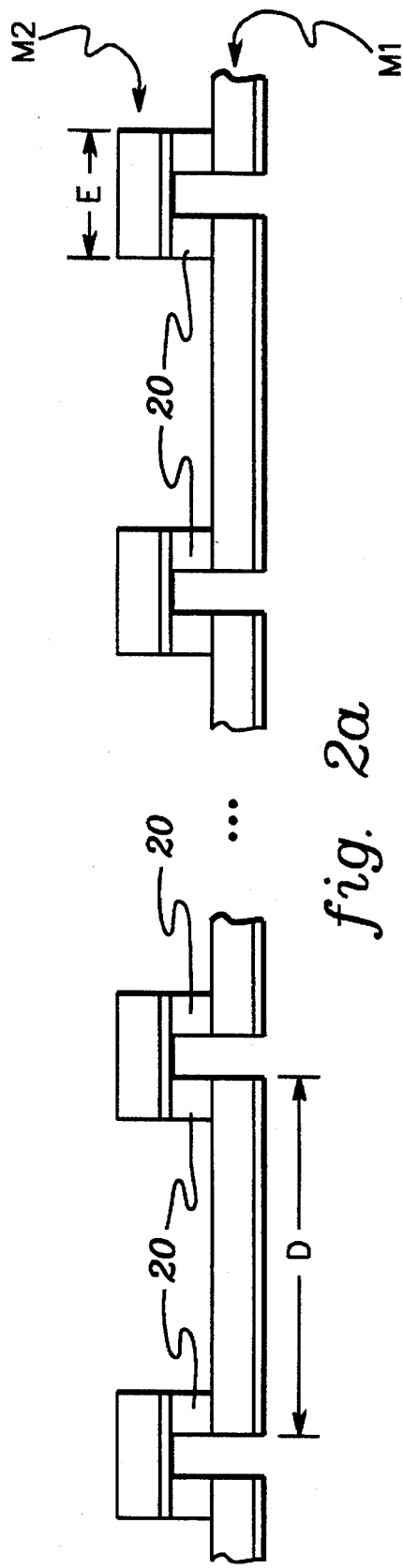
FIGS. 2a & 2b are elevational and plan views, respectively, of one embodiment of a metal control structure in accordance with the present invention, again shown implemented in two metallization levels.

As used herein "metal failure" encompasses any degradation in interconnect conductance of metallization layers of an integrated circuit. In addition to metal voiding, the phrase "metal failure" encompasses, e.g., any constriction of metal interconnect that reduces conductance of the interconnect.

Metal failure detection in accordance with this invention is based on certain empirical observations regarding the occurrence of metal interconnect quality problems during fabrication. A first observation is that metal failure of a semiconductor wafer sporadically occurs and that voiding is present only on certain wafers. Further, when present, voiding typically occurs at multiple locations throughout the wafer. Thus, a test structure can be created for the wafer to signal or flag a wafer having a high probability that metal failure has occurred at other locations on the wafer. Another observation is that metal failure through voiding principally occurs in the aluminum layer of today's composite interconnect wiring, and in particular, in aluminum wiring segments extending beyond a certain minimum length. Closed lengths of short aluminum metal have not been observed to accommodate non-electrical formation of metal voids. Physical evaluation has shown that the typical metal void varies with grain size and length of metal conductors, but generally has the same width as the line conductor and a length of approximately 1 micron.

The critical minimum length of a metal segment below which voiding will not occur can be empirically determined by one of ordinary skill in the art. Non-electrical voiding is believed to be thermally induced during fabrication and may occur from a merging of submicroscopic vacancies within a metal segment. For example, after metallization of a semiconductor wafer, temperatures in the range of 450°–500° C. may be sufficient to initiate metal failure. Again, it is important to the present invention to note that if a metal segment is small enough, there are believed to be insufficient vacancies in the metal structure which can merge together to form a void large enough to cause a perceptible resistance increase. Thus, lengths of segments shorter than the empirically determined minimum length are referred to herein as "resistant" to failure, while those longer than this minimum length are referred to as being "prone" to failure.

In one aspect, this invention comprises a test device consisting of a pair of test structures, referred to as a "monitor structure" and a "control structure," each of which has a plurality of the metal segments. Variations in the lengths of metal segments are employed such that electrical measurements can be made with high sensitivity to the presence of metal failure in the test device. FIGS. 1a & 1b depict one embodiment of a two metallization level (M1, M2) monitor structure in accordance with the present invention. In this embodiment, length 'A' denotes a short M1 segment, length 'B' a long M1 segment, and length 'C' a standard M2 segment. Segment 'A' length and segment 'C' length are chosen sufficiently short to resist voiding within the segment.

Segment 'C' can be chosen as small as possible since the purpose of transitioning between metallization levels is to form discrete, closed metal segments of controlled length. Metal studs 20 interconnect the metal segments on the two metallization levels. As one example, the studs may comprise tungsten studs. In this example, segment 'B' is chosen from empirical data sufficiently long to be prone to metal failure.

As is common with today's interconnect, each metal segment is assumed to comprise a thin film composition of conductive materials. As one specific example, each segment can principally comprise a layer of aluminum metal, along with a single layer of refractory material, such as titanium or tungsten disposed underneath the aluminum layer. A wide variety of alternate composition configurations are possible without departing from the scope of the present invention. For example, a second layer of refractory material could be disposed above the aluminum layer. Further, metal studs 20 could be removed such that the metallization levels physically contact. The only qualification to such a structure would be that the aluminum layers of different segments remain physically isolated such that the length of the aluminum layers in the various segments is known.

Figure 2B:
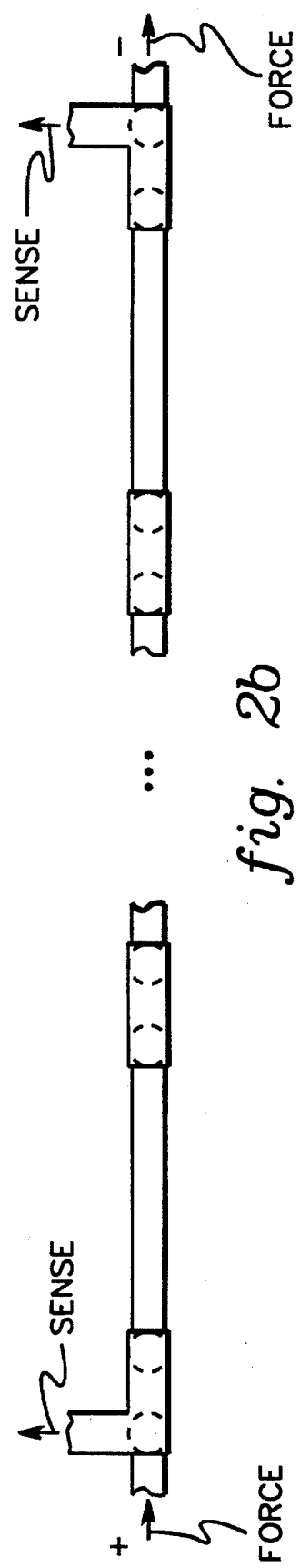

FIGS. 2a & 2b depict one example of a control structure in accordance with the present invention, which is similar to the monitor structure presented in FIGS. 1a & 1b. Principal differences are that segment length 'D' is somewhat longer than segment length 'A' in the monitor structure, and that the control structure lacks a long segment, such as segment 'B' of FIGS. 1a & 1b. Segment length 'E' of metallization level M2 of the control structure may, if desired, be the same length as segment length 'C' of the monitor structure. As one specific example, segments 'A', 'B', 'C', 'D' and 'E' may respectively have lengths of 5 microns, 510 microns, 2 microns, 10 microns, and 2 microns. Again, the second metallization level allows fabrication of closed metal segments of controlled length. Metal vias or studs 20, e.g., fabricated of tungsten, electrically interconnect the metallization levels. The thin film composition of the metal segments in the control structure is the same as that of the monitor structure.

The control structure and the monitor structure are predesigned such that at designated measurement pads, there is an identical resistance between the two structures absent metal failure in that segment of the monitor structure prone to metal failure, e.g., segment 'B' in the monitor structure of FIGS. 1a & 1b. This is achieved by equating the total length of metal segments in the control structure with the total length of metal segments in the monitor structure, in addition to equating the total length of metal segments in respective metallization levels. Further, equal numbers of transitions are employed between metallization levels, such that an equal number of metal studs (if present) are encountered in each structure.

Resistance can be accurately measured via a four point (Kelvin contact) probe which could connect to the monitor and control structures as shown in FIGS. 1b & 2b. The applied force is assumed to comprise a constant current force that is applied to the monitor Structure and to the control structure. Voltage would be sensed across each structure as shown. From the known current and voltage, accurate resistance values are thus readily obtained.

Figure 6:
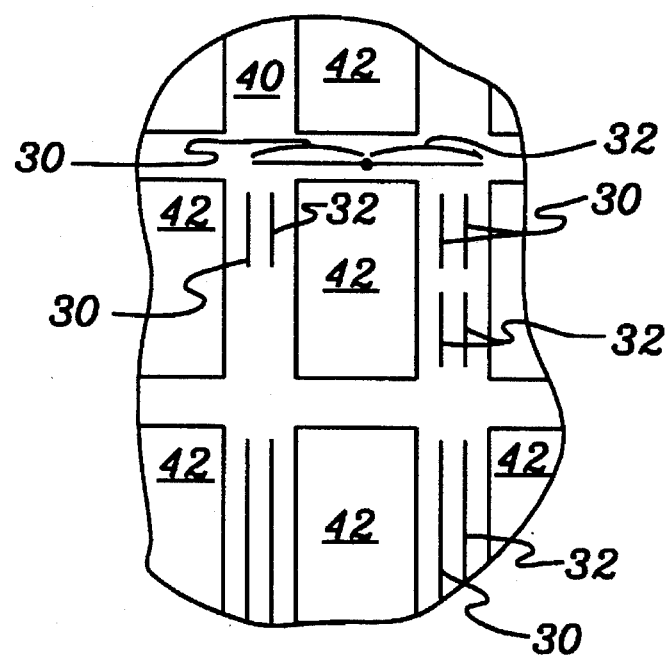
FIG. 6 is a partial plan view of a semiconductor wafer with multiple integrated circuits, and shown with multiple test devices in accordance with the present invention disposed therebetween.

Ideally, the monitor and control structures are disposed on a semiconductor wafer in close proximity so that they experience the same process variations and mechanical forces. The test structures can be disposed over inactive portions of the wafer, for example, in a kerf region or in a designated test chip on the wafer. FIG. 6 depicts a portion of a semiconductor wafer wherein various monitor and control structures 30 & 32, respectively, are shown disposed in the kerf region 40 between integrated circuit chips 42. Structures 30 & 32 are located in various arrangements. A common consideration in each arrangement is the disposition of the monitor structure in close proximity to the control structure. As a further variation, the test structures could be disposed over active chip portions of the wafer, i.e., assuming that there is available space.

By way of example, the monitor and control structures are shown in parallel, in series, and in spaced series alignment.

If desired, a group of monitor and control structure pairings can be implemented to increase the likelihood of accurately flagging metal failure on a wafer. For example, a first monitor and control structure pairing can be constructed for signalling metallization level M1 failures, while a second monitor and control structure pairing can be fabricated for detecting metallization level M2 failures, etc. Further, the configuration of the monitor and control structures themselves can vary, e.g., the individual segment lengths and number of segments can change, according to various factors such as space available, measurement sensitivity desired, extent of metal voiding deemed critical, etc.

Figure 3A:
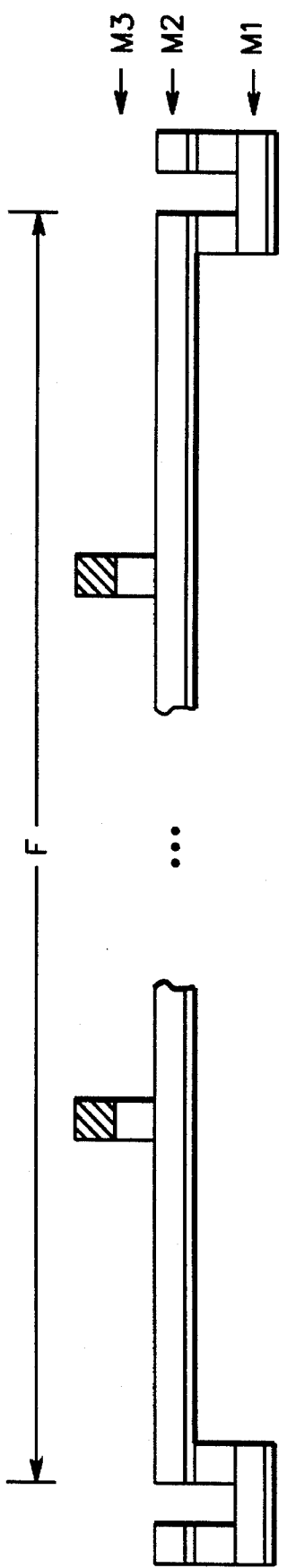
FIGS. 3a & 3b are elevational and plan views, respectively, of an alternate embodiment of a metal monitor structure in accordance with the present invention, shown implemented in three metallization layers.
Figure 3B:
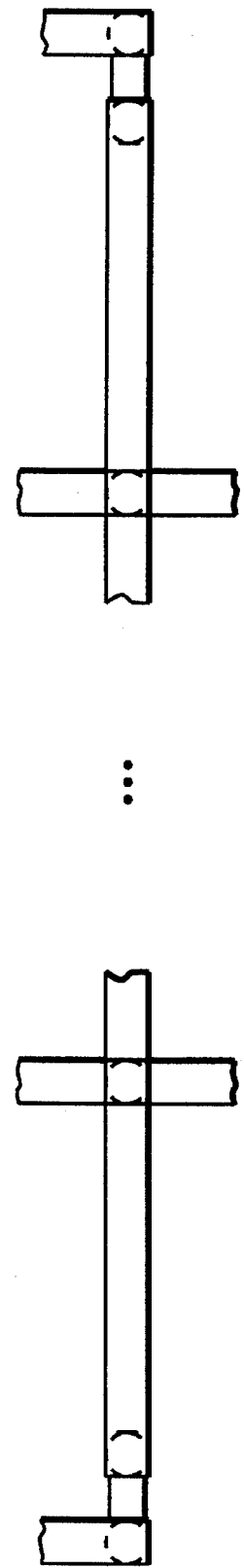

As noted, various monitor and control structure configurations may be desirable to simulate different physical forces on the structures. FIGS. 3a & 3b depict a modified monitor structure wherein a third metallization level M3 crosses and physically and electrically connects to second metallization level M2. The metal segment prone to failure in this monitor structure is assumed to comprise segment length 'F' in metallization level M2. In this embodiment, a downward physical force could be generated in the region of the tungsten studs interconnecting metallization level M3 and metallization level M2, particularly with thermal cycling of the wafer. As shown, such a force is directly applied to that metal segment of the monitor structure having a predesigned disposition to failure.

Figure 4:
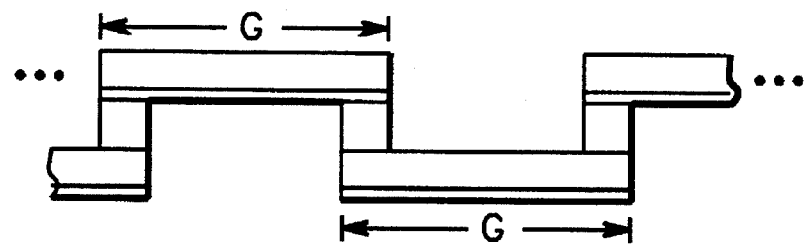
FIG. 4 is an elevational view of an alternate embodiment of a metal control structure for use in connection with monitoring two metallization levels simultaneously.
Figure 5:
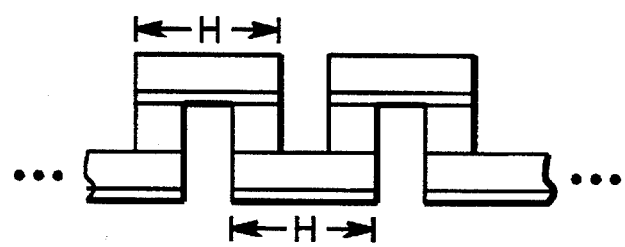
FIG. 5 is an elevational view of an alternate embodiment of a portion of a metal monitor structure in accordance with the present invention for use in connection with monitoring two metallization levels simultaneously.

As a further variation, a single monitor and control structure pairing could be configured with multiple metal segments of the monitor structure prone to failure. For example, a monitor structure may be fabricated with a first metal segment prone to failure in metallization level M1 and a second metal segment prone to failure in metallization level M2. Assuming that the length of the two segments prone to failure are the same, then a control structure such as depicted in FIG. 4 may be employed. Specifically, the metal segment length 'G' is the same in both metallization levels. Again, segment length 'G' is sufficiently short so as to resist metal failure. FIG. 5 depicts one embodiment of the short metal segments of the corresponding monitor structure. As shown, segment length 'H' is the same in both metallization level M1 and metallization level M2. The two metal segments prone to metal failure are omitted from the figure.

To summarize, the present invention comprises test structures and a simple electrical technique for flagging possible metal failure of a wafer to assure quality and reliability of integrated circuit interconnect wiring. The technique can be implemented in various different structure configurations according to numerous factors, such as space available, measurement sensitivity, extent of voiding deemed critical, etc. The monitor and control structures could be designed in series with a voltage tap in the middle to allow, for example, for Kelvin measurements of both structures with a common current source. A grouping or a series of monitors and control structures could be implemented to increase the likelihood of accurately signalling voids. An optimization of the various options is possible based on the assumptions of void nucleation and resistance increase statistics.

While the invention has been described in detail herein in accordance with certain preferred embodiments thereof, many modifications and changes therein may be effected by those skilled in the art. For example, the monitor and control structures presented herein could be readily adapted for use in a Wheatstone bridge. Accordingly, it is intended by the appended claims to cover all such modifications and changes as fall within the true spirit and scope of the invention.

I claim:

1. A test device for signalling possible metal failure of a semiconductor wafer, said test device comprising:

a metal monitor structure prone to metal failure;

a metal control structure resistant to metal failure such that said metal control structure is less prone to metal failure than said metal monitor structure; and wherein said metal monitor structure and said metal control structure have substantially identical resistances without metal failure of said metal monitor structure and a resistance difference upon metal failure of said metal monitor structure, said resistance difference signalling possible metal failure of said semiconductor wafer.

2. The test device of claim 1, wherein said test device is disposed at an inactive region of said semiconductor wafer.

3. The test device of claim 2, wherein said semiconductor wafer contains multiple integrated circuits and wherein said test device is disposed in a kerf region of said semiconductor wafer.

4. The test device of claim 1, wherein said metal monitor structure is disposed adjacent to said metal control structure on said semiconductor wafer.

5. The test device of claim 4, wherein said metal monitor structure and said metal control structure are electrically series connected.

6. The test device of claim 4, wherein said metal monitor structure and metal control structure are disposed in parallel on said semiconductor wafer.

7. The test device of claim 1, wherein metal failure of said metal monitor structure produces an increase in resistance in said metal monitor structure, and wherein contact pads are included in said metal monitor structure and said metal control structure for facilitating electrical determination of the resistance of said metal monitor structure and the resistance of said metal control structure.

8. The test device of claim 1, wherein said metal monitor structure comprises a layered thin film composition including a layer of a refractory material.

9. The test device of claim 8, wherein said layered thin film composition further includes an aluminum layer, and wherein said metal monitor structure is prone to metal failure in said aluminum layer.

10. A test device for signalling possible metal failure of a semiconductor wafer, said test device comprising:

a monitor structure having a first plurality of metal segments electrically connected together, at least one metal segment of said first plurality of metal segments being prone to metal failure;

a control structure having a second plurality of metal segments electrically connected together such that no metal segment of said second plurality of metal segments is prone to metal failure and such that said control structure is less prone to metal failure than said metal monitor structure; and wherein said monitor structure and said control structure have substantially identical resistances without metal failure of said at least one metal segment prone to metal failure, and a resistance difference upon metal failure of said at least one metal segment prone to metal failure, said resistance difference signalling possible metal failure of said semiconductor wafer.

11. The test device of claim 10, wherein said first plurality of metal segments of said monitor structure comprises X metal segments and said second plurality of metal segments of said control structure comprises Y metal segments, and wherein X=Y.

12. The test device of claim 11, wherein said monitor structure has a length L1 and said control structure has a length L2, and wherein length L1= length L2.

13. The test device of claim 12, wherein said monitor structure and said control structure are disposed in close proximity on said semiconductor wafer.

14. The test device of claim 13, wherein said monitor structure and said control structure are disposed in parallel on said semiconductor wafer.

15. The test device of claim 13, wherein said monitor structure and said control structure are electrically series connected.

16. The test device of claim 10, wherein said monitor structure and said control structure each resides on at least two metallization levels of said semiconductor wafer, and wherein each metal segment of said first plurality of metal segments has at least one adjacent metal segment of said first plurality of metal segments disposed on a different metallization level of said at least two metallization levels, and wherein each metal segment of said second plurality of metal segments has at least one adjacent metal segment of said second plurality of metal segments disposed on a different metallization level of said least two metallization levels.

17. The test device of claim 16, wherein for each of said monitor structure and said control structure said at least two metallization levels comprise a first metallization level M1 and a second metallization level M2 disposed on said semiconductor wafer, and wherein said at least one metal segment prone to metal failure of said first plurality of metal segments resides in said first metallization level M1.

18. The test device of claim 10, wherein said monitor structure and said control structure each resides on a first metallization level M1 and a second metallization level M2 on said semiconductor wafer, and wherein a total length of metal segments of said first plurality of metal segments residing on said first metallization level M1 equals a total length of metal segments of said second plurality of metal segments residing on said first metallization level M1, and wherein a total length of segments of said first plurality of metal segments residing on said second metallization level M2 equals a total length of metal segments of said second plurality of metal segments residing on said second metallization level M2.

19. The test device of claim 10, wherein all metal segments of said first plurality of metal segments and said second plurality of metal segments have an identical predefined metal composition.

20. The test device of claim 19, wherein said identical predefined metal composition includes an aluminum layer, and wherein said at least one metal segment of said first plurality of metal segments prone to metal failure is prone to failure in said aluminum layer.

21. The test device of claim 20, wherein said aluminum layer of each metal segment is physically isolated from the aluminum layer of each adjacent metal segment of said first plurality of metal segments and of said second plurality of metal segments.

22. The test device of claim 21, wherein the aluminum layer of each metal segment of said first plurality of metal segments is electrically connected to the aluminum layer of each adjacent metal segment of said first plurality of metal segments via refractory material and wherein the aluminum layer of each metal segment of said second plurality of metal segments is electrically connected to the aluminum layer of each adjacent metal segment of said second plurality of metal segments via said refractory material.

23. The test device of claim 22, wherein said refractory material comprises either a layer of titanium or a layer of tungsten.

24. The test device of claim 22, wherein said refractory material comprises an interconnecting metal stud of titanium or tungsten.

25. The test device of claim 16, wherein each metal segment of said first plurality of metal segments resides on a single metallization level of said at least two metallization levels on said semiconductor wafer, and wherein each metal segment of said second plurality of metal segments resides on a single metallization level of said at least two metallization levels on said semiconductor wafer.

26. The test device claims 16, wherein said at least one segment of said first plurality of metal segments prone to metal failure comprises a first metal segment on a first metallization level of said at least two metallization levels and a second metal segment on a second metallization level of said at least two metallization levels.

27. The test device of claim 10, wherein said monitor structure and said control structure are disposed at an inactive region of said semiconductor wafer.

28. The test device of claim 27, wherein said semiconductor wafer includes multiple integrated circuits and wherein said monitor structure and said control structure are disposed in a kerf region of said semiconductor wafer.

29. A metal test structure for indicating possible metal failure of a semiconductor wafer, said metal test structure comprising:

a plurality of test devices disposed in an inactive region of said semiconductor wafer, each test device of said plurality of test devices comprising:
a metal monitor structure prone to metal failure;
a metal control structure resistant to metal failure such that said metal control structure is less prone to metal failure than said metal monitor structure; and
wherein said metal monitor structure and said metal control structure have substantially identical resistances without metal failure of said metal monitor structure and a resistance difference upon metal failure of said metal monitor structure, said resistance difference signalling possible metal failure of said semiconductor wafer.

30. The metal test structure of claim 29, wherein said semiconductor wafer includes multiple integrated circuits, and wherein said plurality of test devices is disposed in a kerf region of said semiconductor wafer.

31. The metal test structure of claim 29, wherein at least some test devices of said plurality of test devices include metal monitor structures of different physical configuration than other metal monitor structures of other test devices of said plurality of test devices.

32. The metal test structure of claim 31, wherein each of said metal monitor structures of said plurality of test devices occupies at least two metallization levels on said semiconductor wafer.

33. The metal test structure of claim 29, wherein said semiconductor wafer includes multiple metallization levels, and wherein said plurality of test devices includes for each metallization level of said multiple metallization levels at least one test device having a metal monitor structure prone to metal failure in that metallization level.

34. A method for fabricating a test device for indicating possible metal failure of a semiconductor wafer, said method comprising the steps of:

(a) predesigning a metal monitor structure and a metal control structure such that said metal monitor structure is prone to metal failure and said metal control structure is resistant to metal failure, such that said metal control structure is less prone to metal failure than said metal monitor structure, and such that said metal monitor structure and said metal control structure have substantially identical resistances without metal failure of said metal monitor structure and a resistance difference upon metal failure of said metal monitor structure, said resistance difference indicating possible metal failure of said semiconductor wafer; and (b) fabricating said metal monitor structure and said metal control structure at an inactive region of said semiconductor wafer.

35. The method of claim 34, wherein said fabricating step (b) includes proceeding with said step (b) commensurate with fabricating of interconnect metallization at active regions of said semiconductor wafer.

36. The method of claim 34, further in combination with testing said semiconductor wafer for possible metal failure using said metal monitor structure and said metal control structure fabricated in said step (b).

37. The method of claim 36, wherein said testing includes determining a resistance of said metal monitor structure and a resistance of said metal control structure, said resistance determining including forcing a known current through said metal monitor structure and said metal control structure and simultaneously sensing voltages established thereacross.

* * * * *